(12) United States Patent
Kawano

(10) Patent No.: US 11,710,719 B2
(45) Date of Patent: Jul. 25, 2023

(54) METHOD FOR MANUFACTURING ELECTRONIC DEVICE

(71) Applicant: Sumitomo Electric Device Innovations, Inc., Yokohama (JP)

(72) Inventor: Taketo Kawano, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 349 days.

(21) Appl. No.: 17/268,907

(22) PCT Filed: Jun. 8, 2020

(86) PCT No.: PCT/JP2020/022458
§ 371 (c)(1),
(2) Date: Feb. 16, 2021

(87) PCT Pub. No.: WO2020/255764
PCT Pub. Date: Dec. 24, 2020

(65) Prior Publication Data
US 2021/0313297 A1    Oct. 7, 2021

(30) Foreign Application Priority Data

Jun. 19, 2019 (JP) .................................. 2019-113595

(51) Int. Cl.
*H01L 23/00*    (2006.01)
*H01L 25/16*    (2023.01)
*G02B 6/42*    (2006.01)

(52) U.S. Cl.
CPC .............. *H01L 24/83* (2013.01); *H01L 24/32* (2013.01); *H01L 24/73* (2013.01); *H01L 24/92* (2013.01); *H01L 25/165* (2013.01); *H01L 25/167* (2013.01); *G02B 6/421* (2013.01); *G02B 6/4245* (2013.01); *H01L 24/29* (2013.01);
(Continued)

(58) Field of Classification Search
CPC ..... H01L 25/167; H01L 25/165; H01L 24/92; H01L 24/73; H01L 24/32; H01L 24/83
See application file for complete search history.

(56) References Cited

U.S. PATENT DOCUMENTS

| 9,220,172 B2 * | 12/2015 | Tsuduki ................ H01L 23/057 |
| 2004/0238829 A1 | 12/2004 | Kurita et al. |
| 2017/0301612 A1 | 10/2017 | Haga et al. |

FOREIGN PATENT DOCUMENTS

| JP | 2004-071898 A | 3/2004 |
| JP | 2005-005681 A | 1/2005 |

(Continued)

*Primary Examiner* — Jasmine J Clark
(74) *Attorney, Agent, or Firm* — McCarter & English, LLP; Michael A. Sartori

(57) ABSTRACT

A method for manufacturing an electronic component includes preparing a mounting substrate provided with a first region to mount an electronic component thereon and a second region having conductivity, covering the second region with resin, applying a metal paste on the first region, mounting the electronic component on the first region with the metal paste, and removing the resin covering the second region. The mounting includes heating the mounting substrate to cure the metal paste with the electronic components being placed on the metal paste applied on the first region. The resin peeled from the second region by the heating is removed in the removing.

10 Claims, 20 Drawing Sheets

(52) U.S. Cl.
CPC .... *H01L 24/48* (2013.01); *H01L 2224/29005* (2013.01); *H01L 2224/32012* (2013.01); *H01L 2224/32227* (2013.01); *H01L 2224/48227* (2013.01); *H01L 2224/73265* (2013.01); *H01L 2224/83002* (2013.01); *H01L 2224/83095* (2013.01); *H01L 2224/83192* (2013.01); *H01L 2224/83947* (2013.01); *H01L 2224/92247* (2013.01); *H01L 2924/12043* (2013.01)

(56) References Cited

FOREIGN PATENT DOCUMENTS

| | | |
|---|---|---|
| JP | 2015-018843 A | 1/2015 |
| JP | 2016-127219 A | 7/2016 |
| JP | 2017-191895 A | 10/2017 |

\* cited by examiner

METHOD FOR MANUFACTURING ELECTRONIC DEVICE

TECHNICAL FIELD

The present disclosure relates to a method for manufacturing an electronic device.

This application claims the priority based on Japanese Patent Application No. 2019-113595, filed on Jun. 19, 2019, and the entire contents of which are incorporated herein by reference.

BACKGROUND ART

Patent Literature 1 discloses a method for manufacturing a circuit device including a step of forming a die pad and a bonding pad on a metal foil, a step of fixing a semiconductor element to the die pad via a brazing material, and a step of wire bonding the semiconductor element and the bonding pad. This manufacturing method forms a separation groove on the metal foil, thereby the die pad and the bonding pad are separated from each other by the separation groove. At the same time, a groove shallower than the separation groove is formed to surround the region where the semiconductor element is to be fixed to the die pad.

Patent Literature 2 discloses a method for manufacturing a semiconductor device including a step of adhering a brazing material to a metal film provided on a surface of a non-conductive submount, a step of die-bonding a semiconductor light emitting element to the metal film by using a brazing material, and a step of wire bonding a wire to the metal film. The surface of the metal film described above includes a metal film exposure region and a brazing material adhesion region, and a metal removing portion for exposing the submount is provided in the metal film exposure region. The metal removing portion is arranged between a wire bond portion and the brazing material adhesion region.

CITATION LIST

Patent Literature

Patent Literature 1: Japanese Unexamined Patent Publication No. 2004-71898
Patent Literature 2: Japanese Unexamined Patent Publication No. 2005-5681

SUMMARY OF INVENTION

A method for manufacturing an electronic device according to the present disclosure includes: preparing a mounting substrate provided with a first region to mount an electronic component thereon and a second region having conductivity; covering the second region with a resin; applying a metal paste on the first region; mounting the electronic component on the first region with the metal paste; and removing the resin covering the second region. The mounting step includes heating the mounting substrate to cure the metal paste with the electronic component being placed on the metal paste applied on the first region. The resin peeled from the second region by the heating is removed in the removing.

DESCRIPTION OF EMBODIMENTS

Figure 1:
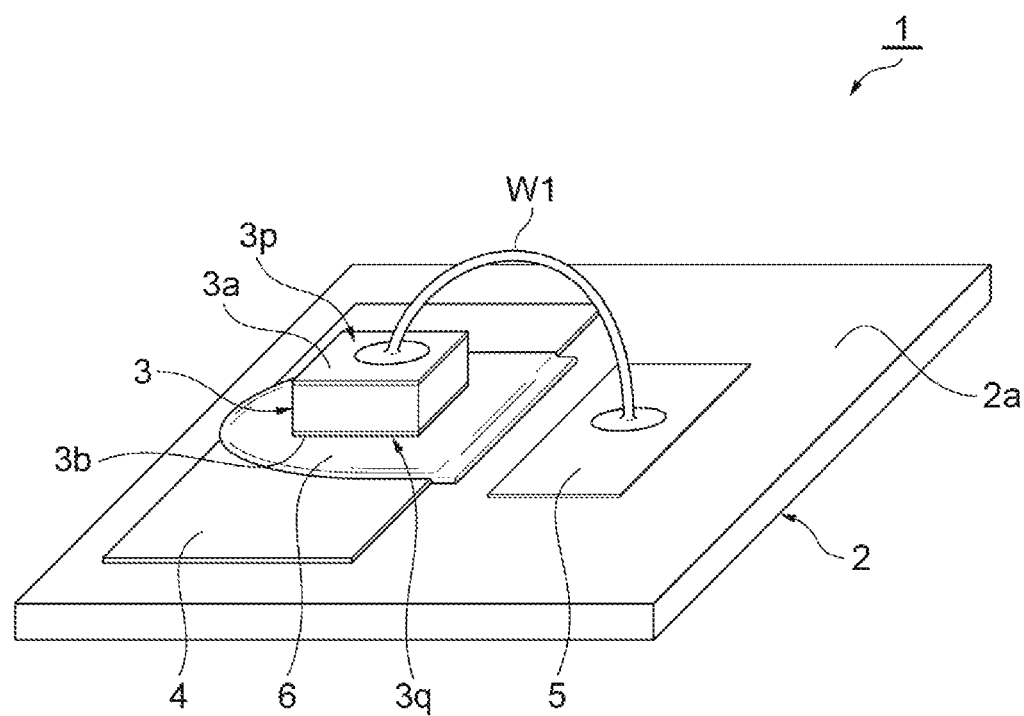
FIG. 1 is a perspective view showing a configuration of an electronic device according to a first embodiment.

Problems to be Solved by the Present Disclosure

When die-bonding an electronic component such as a semiconductor element, a metal paste such as silver paste may be used instead of a brazing material. In such a case, the silver paste may leak and spread to a bonding pat. However, for example, if the silver paste adheres to the region for wire bonding, the adhesion of a bonding wire may decrease due to the adhering silver paste. As described above, due to the leakage and spread of the metal paste, there is a possibility that electrical connection failure occurs by wire bonding or the like.

Advantageous Effects of the Present Disclosure

According to a method for manufacturing an electronic device according to an embodiment of the present disclosure, it is possible to suppress the occurrence of electrical connection failure by wire bonding or the like.

DESCRIPTION OF EMBODIMENTS OF THE PRESENT DISCLOSURE

First, the contents of embodiments of the present disclosure are listed and described. A method for manufacturing an electronic device according to an embodiment includes: preparing a mounting substrate provided with a first region to mount an electronic component thereon and a second region having conductivity; covering the second region with a resin; applying a metal paste on the first region; mounting an electronic component on the first region with the metal paste; and removing the resin covering the second region. The mounting includes heating the mounting substrate to cure the metal paste with the electronic components being placed on the metal paste applied on the first region. The resin peeled from the second region by the heating is removed in the removing.

In the method for manufacturing the electronic device according to the embodiment, the second region is covered with the resin when the metal paste is applied on the first region. Even if the metal paste does not fit in the first region, the metal paste that is to adhere to the second region adheres to the resin. Thus, the adhesion of the metal paste to the second region is suppressed. The resin covering the second region is removed in the removing after the metal paste after mounting the electronic component becomes difficult to flow. Since the resin is peeled from the second region by using the heating of the mounting substrate for curing the metal paste in the mounting, the resin can be easily removed in the removing. Thus, the portion of the metal paste that has adhered to the resin is removed together with the resin. Therefore, the method suppresses the adhesion of the metal paste to the second region exposed from the resin during and after the removal of the resin. As described above, it is possible to suppress the occurrence of electrical connection failure by wire bonding or the like to the second region.

The above method may further include connecting one end of the bonding wire to the second region.

In the above method, the electronic component may include a first surface on which a first electrode is formed and a second surface on which a second electrode is formed facing away from the first surface. The first region may be a conductive region electrically isolated from the second region. The second electrode may be connected to the first region via the metal paste so that the electronic component is mounted on the first region in the mounting. In this case, the resin prevents the metal paste applied on the first region from reaching the second region. Thus, it is possible to avoid impairing the insulation between the first region and the second region.

In the above method, the first electrode and the second region may be connected by wire bonding. In this case, it is conceivable that the first region and the second region are arranged at relatively close positions. Thus, a configuration that prevents the metal paste from reaching the second region by the resin can be applied more effectively.

In the above method, the resin may be a UV curable resin or a thermosetting resin. Many of these resins are easily peeled at a temperature lower than the curing temperature of the metal paste. Thus, by selecting a resin that is easily peeled at a temperature lower than the curing temperature of the metal paste, the resin in the second region can be sufficiently peeled by heating in the mounting.

In the above method, the material of the region around the second region of the mounting substrate may be aluminum oxide or aluminum nitride. The resin is easily peeled from these materials. Thus, even when an exposed region of the main surface of the mounting substrate is covered with the resin in the covering, the resin can be easily peeled from the main surface by heating in the mounting.

In the above method, the resin may be removed together with a part of the metal paste on the resin in the removing. The method may further include curing the resin by heating the mounting substrate at a first temperature before the applying step. The mounting substrate may be heated at a second temperature higher than the first temperature to cure the metal paste in the heating. The second region may be covered with the resin so that the first region is not covered with the resin in the covering.

DETAILS OF EMBODIMENTS OF THE PRESENT DISCLOSURE

Examples of the method for manufacturing the electronic device according to the embodiment of the present disclosure will be described below with reference to the drawings. It should be noted that the present invention is not limited to these examples, and is indicated by the scope of claims, and is intended to include all modifications within the meaning and scope equivalent to the claims. In the following description, the same elements or elements having the same function may be designated by the same reference numerals, and duplicate description may be omitted.

First Embodiment

FIG. 1 is a perspective view showing a configuration of an electronic device 1 according to a first embodiment of the present disclosure. As shown in FIG. 1, the electronic device 1 includes a mounting substrate 2 having insulating properties and a semiconductor chip 3 (electronic component) mounted on the mounting substrate 2. The mounting substrate 2 has, for example, a rectangular plate shape, and has a main surface 2a on which the semiconductor chip 3 is mounted. The mounting substrate 2 includes, for example, aluminum oxide or aluminum nitride. Two electrode pads 4, 5 are provided on the main surface 2a of the mounting substrate 2.

The electrode pads 4, 5 are formed by being metallized with a conductive material. Examples of the materials of the electrode pads 4, 5 include gold (Au). The material of the electrode pads 4, 5 may be silver (Ag). The electrode pad 4 is an example of the first region in the present embodiment, and forms a wiring pattern for mounting the semiconductor chip 3 thereon. The electrode pad 5 is an example of the second region in the present embodiment, and forms a wiring pattern for wire bonding. In the present embodiment, the electrode pads 4, 5 are spaced from each other on the main surface 2a. That is, the electrode pad 4 is a region electrically isolated from the electrode pad 5 on the main surface 2a.

The semiconductor chip 3 is mounted on the electrode pad 4 with a metal paste such as silver paste (Ag paste) 6, for example. The Ag paste 6 has an Ag filler and an epoxy-based binder. The binder is, for example, a thermosetting resin.

The semiconductor chip 3 includes a first surface 3a and a second surface 3b opposite to the first surface 3a. The first surface 3a faces away from the mounting substrate 2. An electrode 3p (first electrode) by, for example, Au metallizing or the like, is formed on the first surface 3a. The electrode 3p is electrically connected to the electrode pad 5 by a wire W1 (bonding wire) including an Au wire. The second surface 3b faces the main surface 2a of the mounting substrate 2. An electrode 3q (second electrode) by, for example, Au metallizing or the like, is formed on the second surface 3b. The electrode 3q is electrically connected to the electrode pad 4 by the Ag paste 6. The sizes of the first surface 3a and the second surface 3b of the semiconductor chip 3 are, for example, 300 μm in length and 700 μm in width.

Figure 2A:
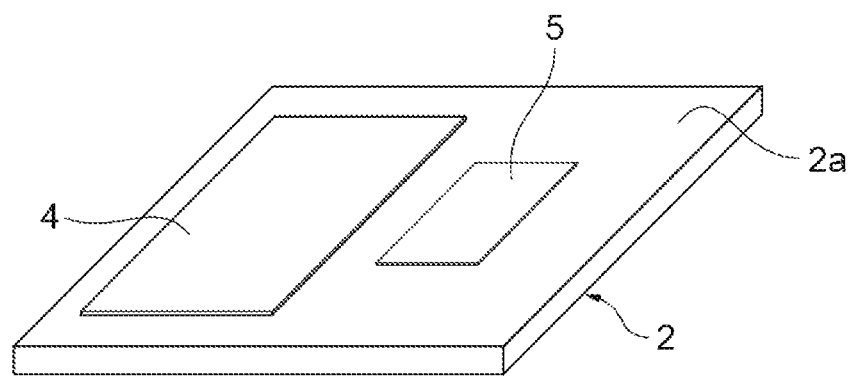
FIG. 2A is a perspective view for explaining a method for manufacturing the electronic device according to the first embodiment.
Figure 2B:
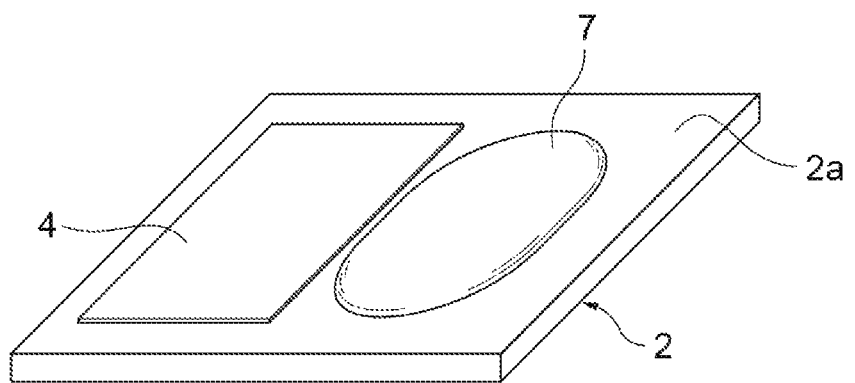
FIG. 2B is a perspective view for explaining the method for manufacturing the electronic device according to the first embodiment, following FIG. 2A.

FIGS. 2A to 4B are perspective views for explaining a method for manufacturing the electronic device 1 according to the first embodiment. First, as shown in FIG. 2A, the mounting substrate 2 provided with the electrode pads 4, 5 is prepared (first step; preparing step). Next, as shown in FIG. 2B, the electrode pad 5 is covered with a molten resin 7 (second step; covering step). At this time, the electrode pad 5 is covered with the resin 7 so that the electrode pad 4 is not covered with the resin 7. Specifically, the resin 7 is applied on the electrode pad 5 by potting the resin 7 or the like. For example, the region around the electrode pad 5 may be covered with the resin 7 from the viewpoint of avoiding the exposure of the electrode pad 5. It is sufficient if at least the electrode pad 5 is covered with the resin 7. For example, the resin 7 is an epoxy-based UV curable resin. A thermosetting resin may be used as the resin 7.

Figure 2C:
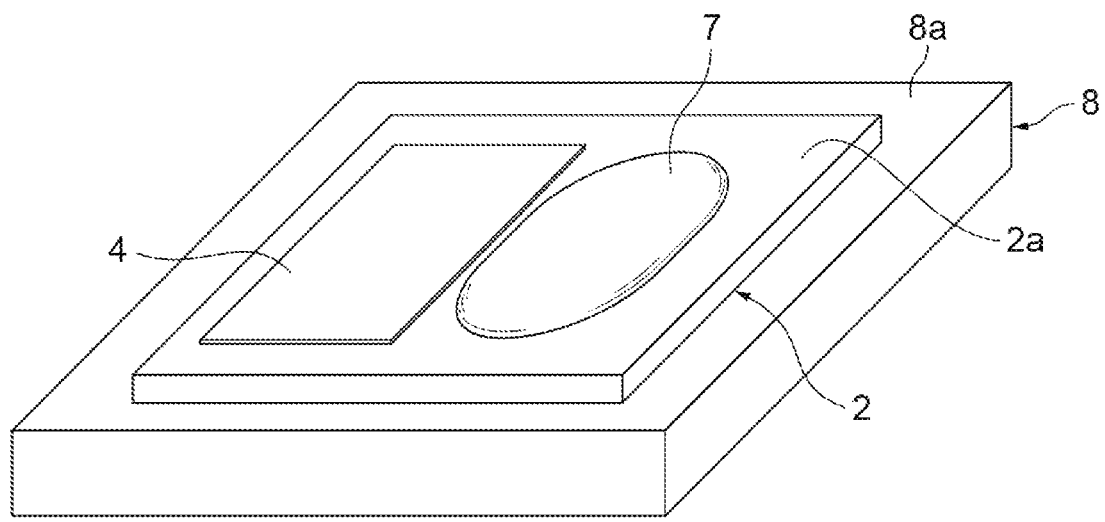
FIG. 2C is a perspective view for explaining the method for manufacturing the electronic device according to the first embodiment, following FIG. 2B.

Next, as shown in FIG. 2C, the resin 7 is cured by heating the mounting substrate 2. Specifically, the mounting substrate 2 is transferred onto a heater block 8, and the mounting substrate 2 is heated by the heater block 8. For example, an upper surface 8a of the heater block 8 is increased to a first temperature (for example, 120 degrees) with the mounting substrate 2 mounted on the upper surface 8a of the heater block 8. The mounting substrate 2 waits until a predetermined time (for example, 60 minutes) elapses in a state where the upper surface 8a is set to the first temperature. Then, the mounting substrate 2 is transferred from the heater block 8 to cool the mounting substrate 2.

Figure 3A:
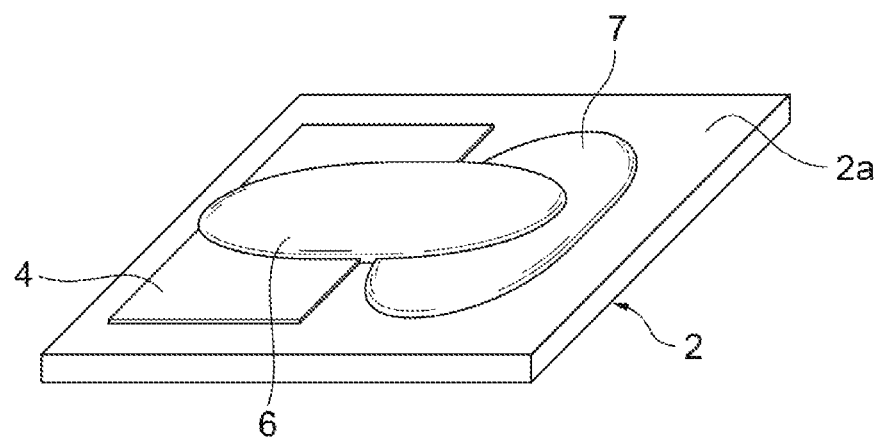
FIG. 3A is a perspective view for explaining the method for manufacturing the electronic device according to the first embodiment, following FIG. 2C.

When the mounting substrate 2 is cooled, the molten Ag paste 6 is applied on the electrode pad 4 as shown in FIG. 3A (third step; applying step). Specifically, the Ag paste 6 is potted or stamped in the region of the electrode pad 4 where the semiconductor chip 3 is mounted. At this time, the Ag paste 6 applied on the electrode pad 4 may flow to leak and spread to the periphery of the electrode pad 4.

Figure 3B:
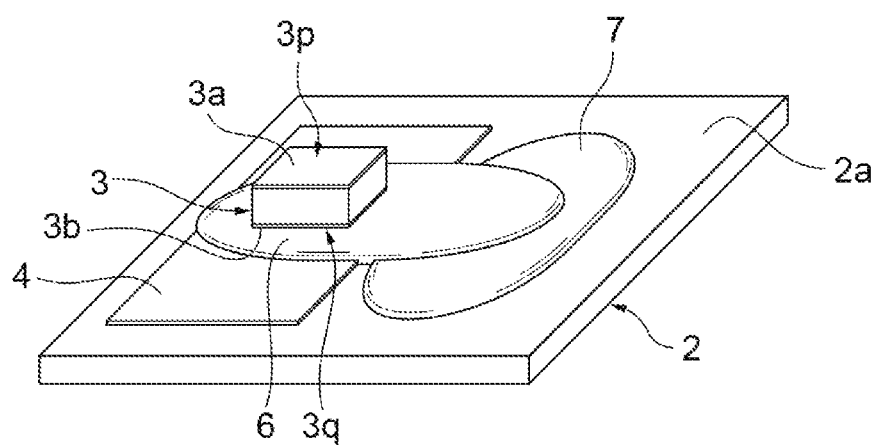
FIG. 3B is a perspective view for explaining the method for manufacturing the electronic device according to the first embodiment, following FIG. 3A.

Next, the semiconductor chip 3 is mounted on the electrode pad 4 by using the Ag paste 6 (fourth step; mounting step). The fourth step includes a placing step and a heating step. In the placing step, as shown in FIG. 3B, the semiconductor chip 3 is placed on the Ag paste 6 applied on the electrode pad 4. At this time, the semiconductor chip 3 is placed on the mounting substrate 2 with the first surface 3a facing the side opposite to the mounting substrate 2 and the second surface 3b facing the electrode pad 4 via the Ag paste 6.

Figure 3C:
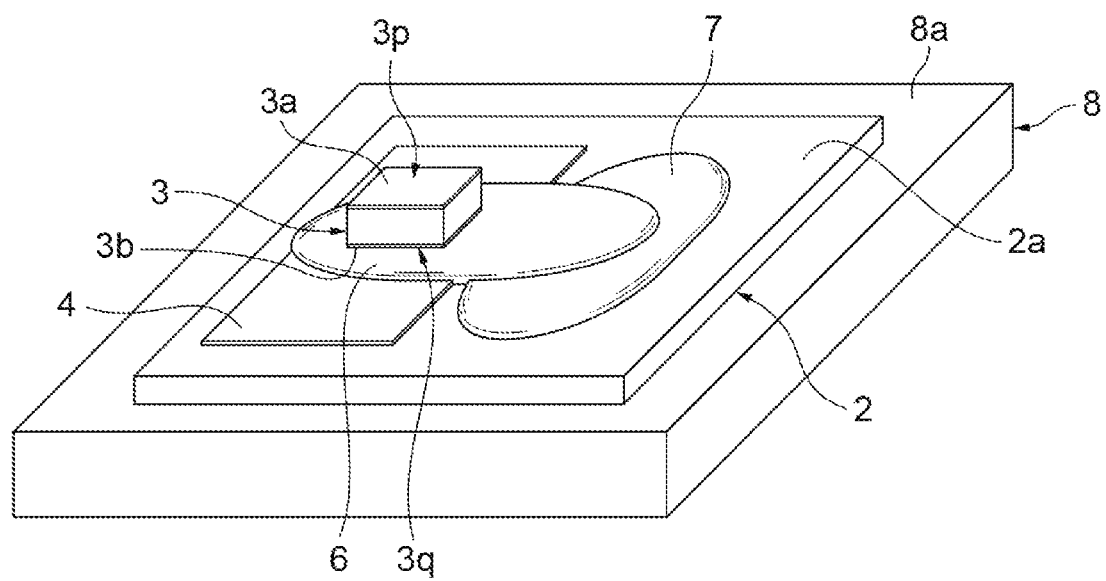
FIG. 3C is a perspective view for explaining the method for manufacturing the electronic device according to the first embodiment, following FIG. 3B.

In the heating step, as shown in FIG. 3C, the mounting substrate 2 is heated to cure the Ag paste 6 with the semiconductor chip 3 placed on the Ag paste 6 applied on the electrode pad 4. Specifically, the mounting substrate 2 is again transferred onto the heater block 8, and the mounting substrate 2 is heated by the heater block 8. For example, the upper surface 8a of the heater block 8 is increased to a second temperature (for example, 180 degrees) higher than the first temperature with the mounting substrate 2 mounted on the upper surface 8a of the heater block 8. Then, waiting is performed for a predetermined time (for example, 60 minutes) in a state where the upper surface 8a is set to the second temperature. Thus, the Ag paste 6 is cured.

In the heating step, the resin 7 is peeled from the electrode pad 5. It is considered that this is because when the resin 7 becomes a high temperature, the resin 7 shrinks (or expands) more than the surface (for example, alumina) of the mounting substrate 2. In the example of the present embodiment, as shown in Table 1, the resin 7 is particularly easy to be peeled at the curing temperature of the Ag paste 6. Table 1 shows the relationship between the degree of peeling of the resin 7 and the degree of curing of the Ag paste 6 at each temperature. At this time, when the resin 7 is peeled from the electrode pad 5, the portion of the Ag paste 6 adhering to the resin 7 is also peeled together with the resin 7.

TABLE 1

| Temperature | Resin | Ag paste |
| --- | --- | --- |
| 120° C. | completely cured | uncured |
| 140° C. | a little peeled | a little cured |
| 160° C. | medium peeled | midium cured |
| 180° C. | completely peeled | completely cured |

Figure 4A:
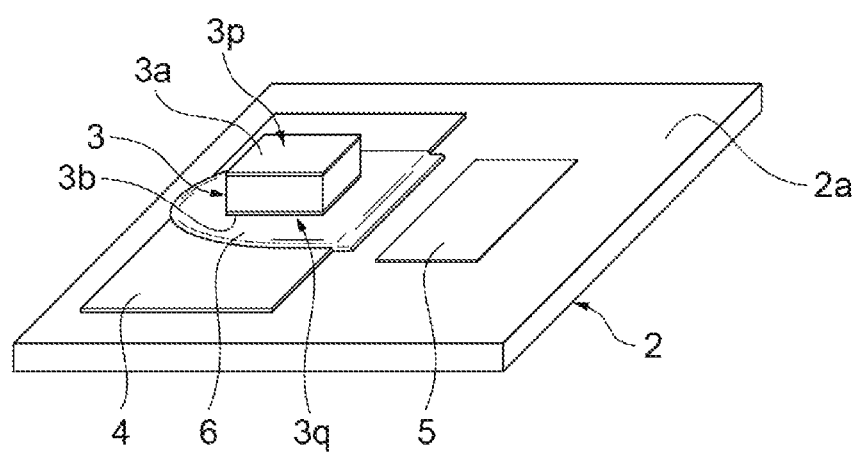
FIG. 4A is a perspective view for explaining the method for manufacturing the electronic device according to the first embodiment, following FIG. 3C.

Next, as shown in FIG. 4A, the resin 7 covering the electrode pad 5 is removed (fifth step; removing step). In the fifth step, the resin 7 in a state of being peeled from the electrode pad 5 by the heating step is removed by using, for example, tweezers or an air blow. At this time, the Ag paste 6 peeled together with the resin 7 is also removed. Thus, the electrode pad 5 is exposed.

Figure 4B:
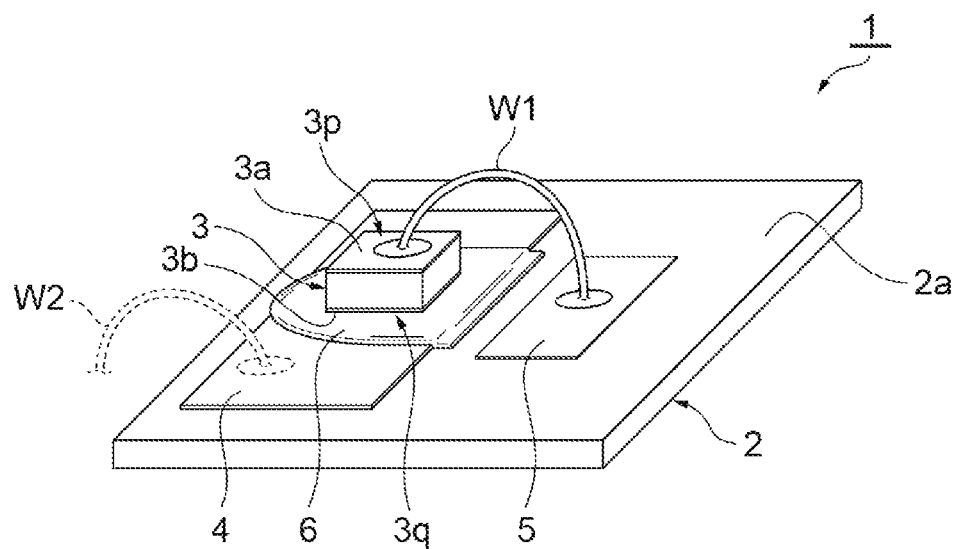
FIG. 4B is a perspective view for explaining the method for manufacturing the electronic device according to the first embodiment, following FIG. 4A.

Next, as shown in FIG. 4B, one end of the wire W1 is connected to the electrode pad 5 by bonding (sixth step; connecting step). The other end of the wire W1 is connected to the electrode 3p of the semiconductor chip 3 by bonding. Thus, the electrode 3p and the electrode pad 5 are connected by wire bonding. As described above, the mounting of the semiconductor chip 3 on the electronic device 1 is completed, and the electronic device 1 is manufactured.

Then, the electronic device 1 may be connected to another electronic device or the like. For example, the region of the electrode pad 4 where the Ag paste 6 is not applied is electrically connected to another electronic device by a wire W2. In the second step, the region to which one end of the wire W2 is connected may be further covered with the resin 7.

The operation and advantageous effect of the method for manufacturing the electronic device 1 described above will be described. In the method for manufacturing the electronic device 1 according to the present embodiment, the Ag paste 6 is used for mounting the semiconductor chip 3 on the electrode pad 4. The Ag paste 6 is highly versatile and has high adhesion. Thus, the adhesion between the semiconductor chip 3 and the electrode pad 4 can be ensured by using a highly versatile material.

Figure 11A:
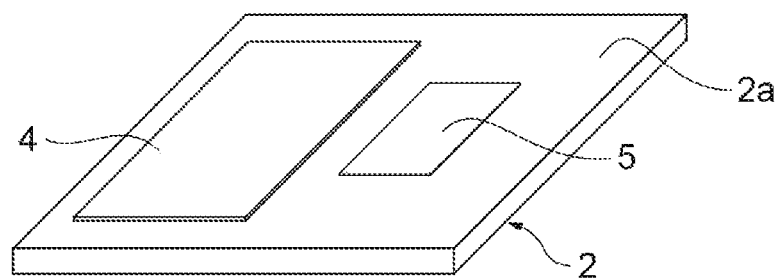
FIG. 11A is a perspective view for explaining a method for manufacturing an electronic device according to a comparative example.
Figure 11B:
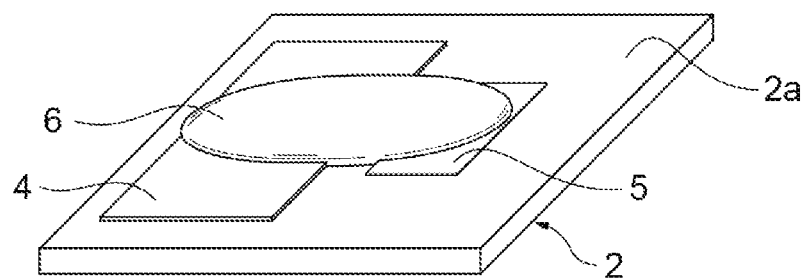
FIG. 11B is a perspective view for explaining the method for manufacturing the electronic device according to the comparative example, following FIG. 11A.

Here, a manufacturing method according to a comparative example when such Ag paste 6 is used will be described. FIGS. 11A to 11D are perspective views for explaining a method for manufacturing an electronic device 1X according to a comparative example. First, as shown in FIG. 11A, a mounting substrate 2 provided with the electrode pads 4, 5 is prepared. This step is performed in the same manner as the first step. Next, as shown in FIG. 11B, a molten Ag paste 6 is applied on the electrode pad 4. Here, as in the third step described above, the Ag paste 6 is potted or stamped in the region of the electrode pad 4 where the semiconductor chip 3 is mounted. At this time, the Ag paste 6 applied on the electrode pad 4 can flow to leak and spread to the periphery of the electrode pad 4.

Figure 11C:
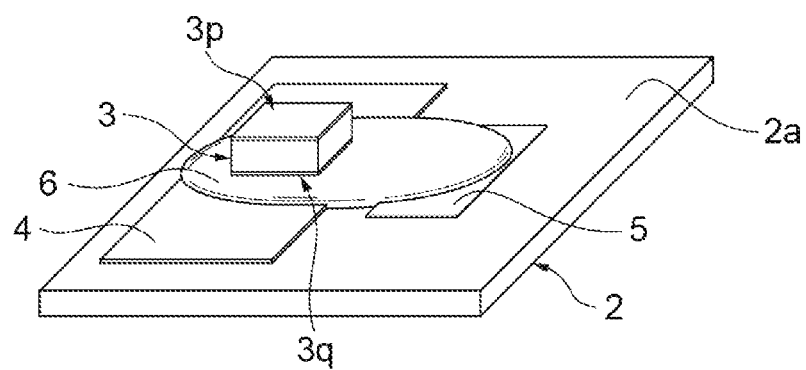
FIG. 11C is a perspective view for explaining the method for manufacturing the electronic device according to the comparative example, following FIG. 11B.

Next, as shown in FIG. 11C, the semiconductor chip 3 is mounted on the electrode pad 4 by using the Ag paste 6. This step is performed in the same manner as the fourth step. Thus, the Ag paste 6 is cured. On the other hand, the Ag paste 6 that has leaked and spread to the periphery of the electrode pad 4 in the molten state also cures as it is. Thus, the cured Ag paste 6 can cover the electrode pad 5.

Figure 11D:
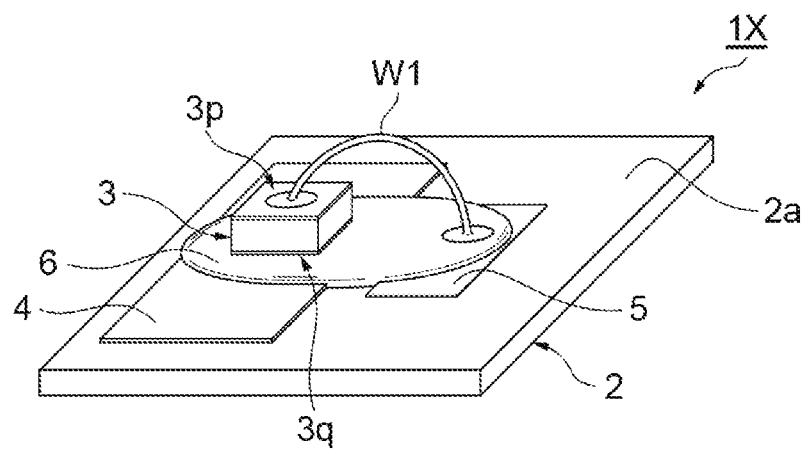
FIG. 11D is a perspective view for explaining the method for manufacturing the electronic device according to the comparative example, following FIG. 11C.

As shown in FIG. 11D, if the electrode 3p and the electrode pad 5 are to be electrically connected by the wire W1 in that state, one end of the wire W1 will be connected to the Ag paste 6. However, in the electronic device 1X manufactured in this way, the insulation of the electrode pads 4, 5 is impaired. Thus, for example, when different potentials are applied to the electrode 3q and the electrode pad 5, it causes malfunction.

Even if the electrode pad 4 is not provided, there is a possibility that wire bonding failure occurs, such as a decrease in adhesion due to wire bonding due to the Ag paste 6 adhering to the electrode pad 5. This is because the binder of the Ag paste 6 shrinks due to heat, and the outgas generated by the shrinkage adheres to the surface of the Ag paste 6. Further, the binder causes a bleed-out phenomenon in the Ag paste 6.

On the other hand, in the method for manufacturing the electronic device 1 according to the present embodiment, when the Ag paste 6 is applied on the electrode pad 4, the electrode pad 5 is covered with the resin 7. Even if the Ag paste 6 does not fit in the electrode pad 4, the Ag paste 6 that is to adhere to the electrode pad 5 will adhere to the resin 7. Thus, the Ag paste 6 is suppressed from adhering to the electrode pad 5. The resin 7 covering the electrode pad 5 is removed in the fifth step after the Ag paste 6 after mounting the semiconductor chip 3 becomes difficult to flow. Here, in the fourth step, since the resin 7 is peeled from the electrode pad 5 by using the heating of the mounting substrate 2 for curing the Ag paste 6, the resin 7 can be easily removed in the fifth step. Thereby, the portion of the Ag paste 6 adhering to the resin 7 is removed together with the resin 7. Thus, the Ag paste 6 is suppressed from adhering to the electrode pad 5 exposed from the resin 7 during and after the removal of the resin 7. Therefore, it is possible to suppress the occurrence of wire bonding failure. As described above, both the reliability of the electrical connection of the semiconductor chip 3 and the electrode pad 4 and the reliability of the electrical connection of the electrode 3p and the electrode pad 5 can be improved.

The semiconductor chip 3 includes a first surface 3a on which the electrode 3p is formed and a second surface 3b on which the electrode 3q is formed so as to face away from the first surface 3a. The electrode pad 4 is a conductive region electrically isolated from the electrode pad 5. In the fourth step, the semiconductor chip 3 is mounted on the electrode pad 4 by connecting the electrode 3q to the electrode pad 4 via the Ag paste 6. In this case as well, since the resin 7 prevents the Ag paste 6 applied on the electrode pad 4 from reaching the electrode pads 5, it is possible to avoid impairing the insulation of the electrode pads 4, 5. Thus, malfunction can be avoided.

The electrode 3p and the electrode pad 5 are connected by wire bonding. In this configuration, the electrode pad 4 and the electrode pad 5 are arranged at relatively close positions. Thus, a configuration that prevents the Ag paste 6 from reaching the electrode pad 5 by the resin 7 can be applied more effectively.

The resin 7 is a UV curable resin or a thermosetting resin. Many of these materials are easily peeled at a temperature lower than the curing temperature of the Ag paste 6. Thus, by selecting a resin 7 that is easily peeled at a temperature lower than the curing temperature of the Ag paste 6, the resin 7 of the electrode pad 5 can be sufficiently peeled by heating in the fourth step (see FIG. 3C). As the metal paste, in addition to the Ag paste 6, a paste made of a material having a curing temperature higher than the peeled temperature of the resin 7 can also be used. Examples of the metal paste other than the Ag paste 6 include gold paste (Au paste), copper paste (Cu paste), solder (tin lead) paste and the like.

The material of the region around the electrode pad 5 of the mounting substrate 2 is aluminum oxide or aluminum nitride. Since the resin 7 is easily peeled from these materials, even when an exposed region of the main surface 2a of the mounting substrate 2 is covered with the resin 7 in the second step (see FIG. 2B), the resin 7 can be easily peeled from the main surface 2a by heating in the fourth step.

Second Embodiment

Figure 5:
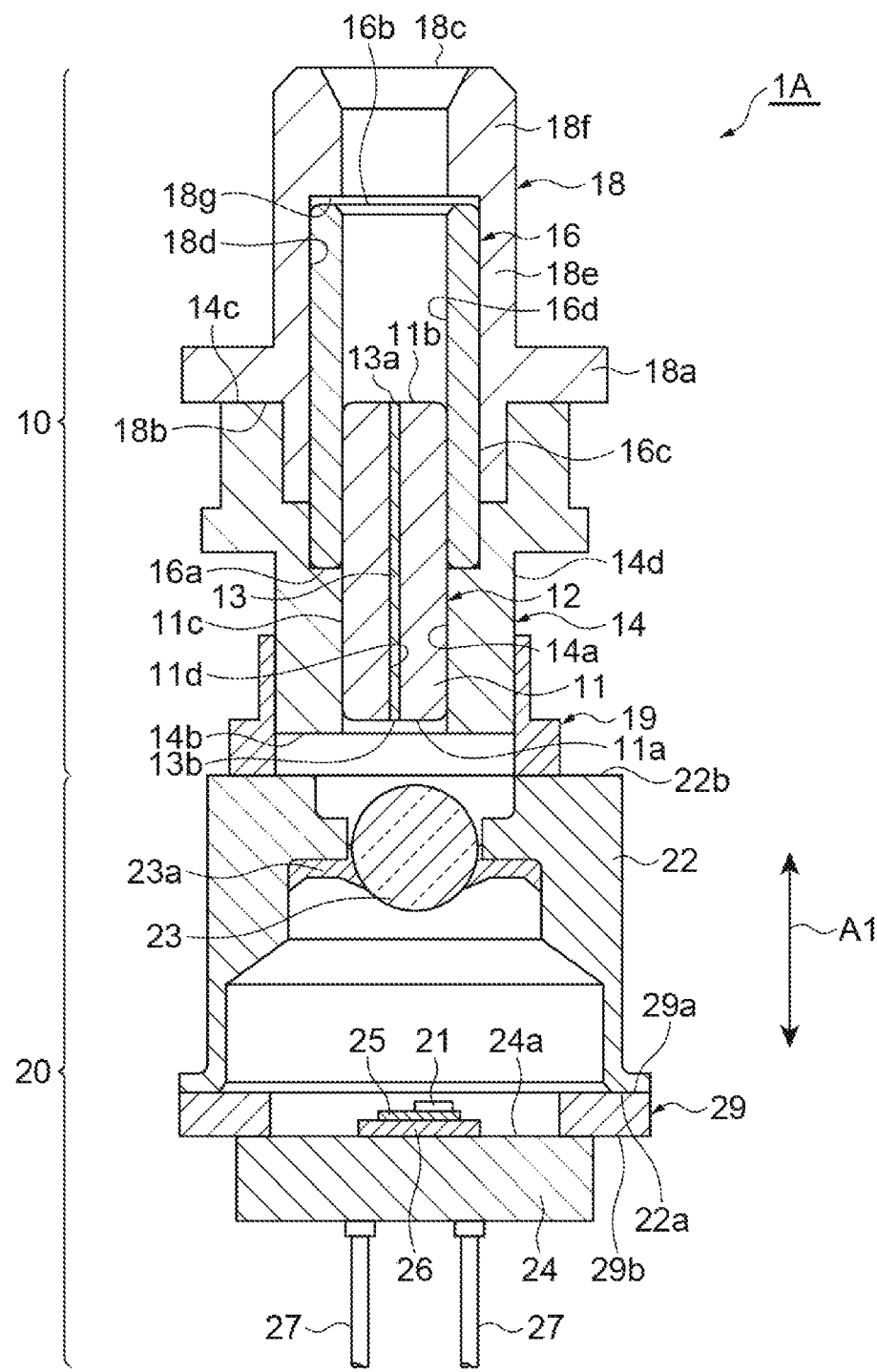
FIG. 5 is a cross-sectional view showing a configuration of a light receiving module according to a second embodiment.

Next, as a second embodiment, a method for manufacturing a light receiving module 1A including the method for manufacturing the electronic device 1 according to the first embodiment will be described. FIG. 5 is a cross-sectional view showing the configuration of the light receiving module 1A according to the second embodiment, showing a cross section along the optical axis of incident light. As shown in FIG. 5, the light receiving module 1A includes an optical receptacle 10 connected to an optical fiber and a light receiving portion 20 fixed to the optical receptacle 10. The optical receptacle 10 has a fiber stub (stub ferrule) 12, a metal member 14, a sleeve 16, and an outer member (shell) 18. The fiber stub 12 has a ferrule 11 and an optical fiber 13.

The ferrule 11 has a cylindrical shape (or a columnar shape). The central axis of the ferrule 11 extends along direction A1, and the cross section of the ferrule 11 perpendicular to the central axis is circular. The ferrule 11 has a proximal end surface 11a and a distal end surface 11b aligned in the direction A1. The distal end surface 11b is a surface that makes physical contact with a ferrule of an optical connector connected to the optical receptacle 10, and is polished into, for example, a spherical surface. The proximal end surface 11a is a surface opposite to the distal end surface 11b and faces the light receiving portion 20 attached to the optical receptacle 10. The proximal end surface 11a is slightly inclined (for example, about 8°) with respect to the surface perpendicular to the central axis of the ferrule 11. The ferrule 11 further has an outer peripheral surface 11c, which is a cylindrical surface.

The ferrule 11 further has a fiber holding hole 11d. The fiber holding hole 11d extends along the direction A1 and is formed on the central axis of the ferrule 11. The cross section of the fiber holding hole 11d is a circular shape, and its inner diameter is slightly larger than the outer diameter of the optical fiber 13. One opening of the fiber holding hole 11d is included in the distal end surface 11b, and the other opening of the fiber holding hole 11d is included in the proximal end surface 11a. That is, the fiber holding hole 11d penetrates between the proximal end surface 11a and the distal end surface 11b of the ferrule 11 along the direction A1. The ferrule 11 is made of, for example, zirconia ($ZrO_2$).

By forming the ferrule 11 with zirconia having high toughness and Young's modulus, physical contact can be preferably performed on the distal end surface 11b.

The optical fiber 13 is, for example, a single-mode fiber, which is a bare fiber from which a resin cover has been removed. The optical fiber 13 is made of, for example, quartz. The optical fiber 13 extends in the longitudinal direction (optical axis direction) in the direction A1 and has one end 13a and the other end 13b. The optical fiber 13 is inserted into the fiber holding hole 11d. The one end 13a is exposed from the opening of the fiber holding hole 11d at the distal end surface 11b, and the other end 13b is exposed from the opening of the fiber holding hole 11d at the proximal end surface 11a. The one end 13a comes into contact with one end of the optical fiber of another optical connector connected to the optical receptacle 10. The other end 13b is optically coupled to a photodiode 21 (described later) of the light receiving portion 20. The outer diameter of the optical fiber 13 is, for example, 125 μm.

The metal member 14 has a through-hole 14a extending in the direction A1 and holds the fiber stub 12 in the through-hole 14a. The metal member 14 is made of a metal material such as stainless steel, for example. The metal member 14 has a cylindrical shape extending along the direction A1. The metal member 14 has a proximal end surface 14b, a distal end surface 14c, and an outer peripheral surface 14d. The proximal end surface 14b and the distal end surface 14c are aligned in the direction A1, and the through-hole 14a penetrates between the proximal end surface 14b and the distal end surface 14c. The cross section of the through-hole 14a perpendicular to the direction A1 is circular. The proximal end surface 14b faces a package 22 (described later) of the light receiving portion 20. The fiber stub 12 is press-fit into the through-hole 14a of the metal member 14 along the direction A1. That is, the outer peripheral surface 11c of the ferrule 11 is in contact with the inner surface of the through-hole 14a, and thus the fiber stub 12 is fixed to the metal member 14.

The sleeve 16 is a cylindrical member extending along the direction A1 and is made, for example, of ceramic. In one example, the sleeve 16 is made of the same material as the ferrule 11 (for example, zirconia). The inner diameter of the sleeve 16 is substantially equivalent to the outer diameter of the fiber stub 12. The sleeve 16 has a proximal end 16a and a distal end 16b aligned in the direction A1. The sleeve 16 has an outer peripheral surface 16c and an inner peripheral surface 16d. The fiber stub 12 is inserted through the opening of the sleeve 16 at the proximal end 16a. In other words, a part of the sleeve 16 near the proximal end 16a is inserted into a gap between the outer peripheral surface 11c of the ferrule 11 and the metal member 14. Thus, the outer peripheral surface 16c of the sleeve 16 is in contact with the metal member 14, and the inner peripheral surface 16d of the sleeve 16 is in contact with the outer peripheral surface 11c of the ferrule 11. An optical connector ferrule is inserted through the opening of the sleeve 16 at the distal end 16b. The distal end surface 11b of the ferrule 11 and the distal end surface of the optical connector ferrule are in contact with each other in the sleeve 16. Thus, the optical fiber 13 held by the ferrule 11 and the optical fiber held by the optical connector ferrule are optically coupled to each other with high coupling efficiency.

The outer member 18 is fixed to the metal member 14 and connected to the optical connector. The outer member 18 is a cylindrical member extending along the direction A1, and is made of, for example, a metal or an alloy such as stainless steel. The outer member 18 has a flange portion 18a and a through-hole 18d extending along the direction A1. The outer member 18 has a proximal end surface 18b and a distal end portion 18c aligned in the direction A1. The flange portion 18a is a disk-shaped portion that protrudes toward the outside of the outer member 18. The flange portion 18a is provided on the outer member 18 near the proximal end surface 18b, and in the present embodiment, one surface of the flange portion 18a constitutes the proximal end surface 18b. The through-hole 18d penetrates between the proximal end surface 18b and the distal end portion 18c. The cross section of the through-hole 18d perpendicular to the direction A1 is circular. The central axis of the through-hole 18d overlaps with the central axis of the fiber stub 12 and the metal member 14. The outer member 18 includes a first portion 18e near the proximal end surface 18be and a second portion 18f near the distal end portion 18c as a part of the through-hole 18d. The first portion 18e extends from the proximal end surface 18b to the second portion 18f along the direction A1. The second portion 18f extends from the distal end portion 18c to the first portion 18e along the direction A1. The first portion 18e and the second portion 18f are connected (communicated) with each other between the distal end 16b of the sleeve 16 and the distal end portion 18c. The inner diameter of the first portion 18e is substantially equivalent to or slightly larger than the outer diameter of the outer peripheral surface 16c of the sleeve 16. The inner diameter of the second portion 18f is slightly larger than the inner diameter of the inner peripheral surface 16d of the sleeve 16. As described above, since the inner diameter of the first portion 18e is larger than the inner diameter of the second portion 18f, a stepped surface 18g is formed between the first portion 18e and the second portion 18f. The stepped surface 18g faces the distal end 16b of the sleeve 16.

The light receiving portion 20 corresponds to the electronic device 1 of the first embodiment. The light receiving portion 20 includes the photodiode 21 (light receiving element), the package 22, a lens 23, a stem 24, a carrier 25, an integrated circuit chip 26, and a plurality of lead pins 27.

The stem 24 corresponds to the mounting substrate 2 of the first embodiment. The stem 24 is an insulating member having a substantially circular flat plate shape and has a flat main surface 24a. The main surface 24a intersects the optical axis of the optical fiber connected to the optical receptacle 10 (that is, the optical axis of the optical fiber 13). In one example, the main surface 24a is perpendicular to the optical axis of the optical fiber connected to the optical receptacle 10 (the optical axis of the optical fiber 13). The stem 24 is made of a ceramic material such as aluminum oxide or aluminum nitride, for example.

The package 22 is a metal member having a substantially cylindrical shape. The central axis of the package 22 is along the optical axis of the optical fiber 13. One end 22a of the package 22 near the proximal end in the optical axis direction of the optical fiber 13 is fixed to the main surface 24a of the stem 24 via a member 29 having an annular shape. Specifically, the member 29 having an annular shape has one end surface 29a and the other end surface 29b in the optical axis direction. The one end 22a of the package 22 near the proximal end is fixedly secured to the one end surface 29a of the member 29, and the main surface 24a of the stem 24 is fixedly secured to the other end surface 29b of the member 29. The one end 22b of the package 22 near the distal end in the optical axis direction of the optical fiber 13 is fixed to the metal member 14 via a member 19 having a cylindrical shape. Specifically, the metal member 14 is inserted from one end of the member 19 near the distal end, and the outer peripheral surface of the metal member 14 and the inner peripheral surface of the member 19 are fixedly secured to each other. The one end 22b of the package 22 near the distal end is fixedly secured to the surface of the member 19 near the proximal end. The package 22 is made of a material such as an iron-nickel alloy, for example.

The plurality of lead pins 27 are a metal member having a rod shape extending in a direction intersecting the main surface 24a of the stem 24. The plurality of lead pins 27 are provided so as to penetrate the stem 24 and are fixed to the stem 24. The plurality of lead pins 27 transfer electric signals and power supplies to the photodiode 21 and the integrated circuit chip 26 arranged in a space defined by the package 22 and the stem 24.

The lens 23 is held inside the package 22 and is fixed to the inner peripheral surface of the package 22 via resin 23a. The lens 23 is a condensing lens made of a light transmitting member, and is arranged on the optical axis of the optical fiber 13. The lens 23 condenses the light emitted from the other end 13b of the optical fiber 13 toward the vicinity of the photodiode 21. The optical axis of the lens 23 is slightly offset with respect to the optical axis of the optical fiber 13 in order to prevent return light from the photodiode 21.

The photodiode 21 is optically coupled to the other end 13b of the optical fiber 13 via the lens 23, receives light from the optical fiber connected to the optical receptacle 10, and outputs a current signal having a size corresponding to the intensity of the light. The photodiode 21 is mounted on an insulating carrier 25, and the carrier 25 is arranged on the integrated circuit chip 26. That is, the photodiode 21 is mounted on the integrated circuit chip 26 via the carrier 25. The integrated circuit chip 26 is a semiconductor IC that receives the current signal from the photodiode 21 and converts the current signal into a voltage signal.

Figure 6:
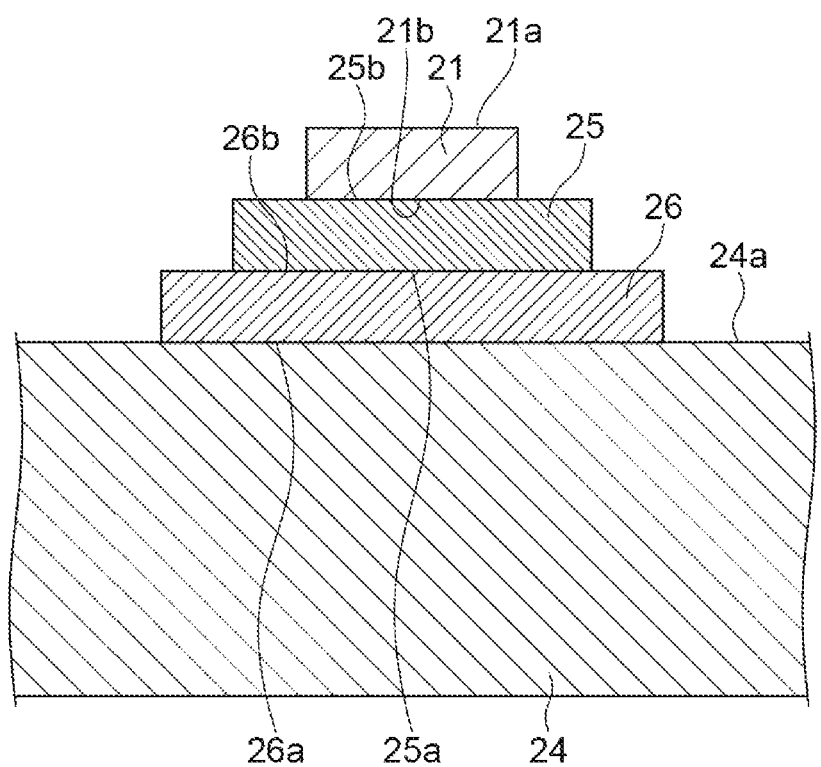
FIG. 6 is an enlarged cross-sectional view showing a configuration of a light receiving portion of the light receiving module shown in FIG. 5 in the vicinity of a photodiode.

Here, FIG. 6 is an enlarged side view showing a configuration of the light receiving portion 20 in the vicinity of the photodiode 21. As shown in FIG. 6, the integrated circuit chip 26 has a third surface 26b and a fourth surface 26a opposite to the third surface 26b. The fourth surface 26a and the third surface 26b are aligned in the optical axis direction of the optical fiber 13 and extend along a plane intersecting (for example, orthogonal to) the optical axis direction. The integrated circuit chip 26 faces the main surface 24a of the stem 24 on the fourth surface 26a. The carrier 25 has a first surface 25b and a second surface 25a opposite to the first surface 25b. The carrier 25 faces the third surface 26b of the integrated circuit chip 26 on the second surface 25a. The photodiode 21 has a main surface 21a and an opposite surface 21b opposite to the main surface 21a, and receives the light at the main surface 21a. The carrier 25 mounts the photodiode 21 on the first surface 25b so that the first surface 25b and the opposite surface 21b of the photodiode 21 face each other.

Figure 7:
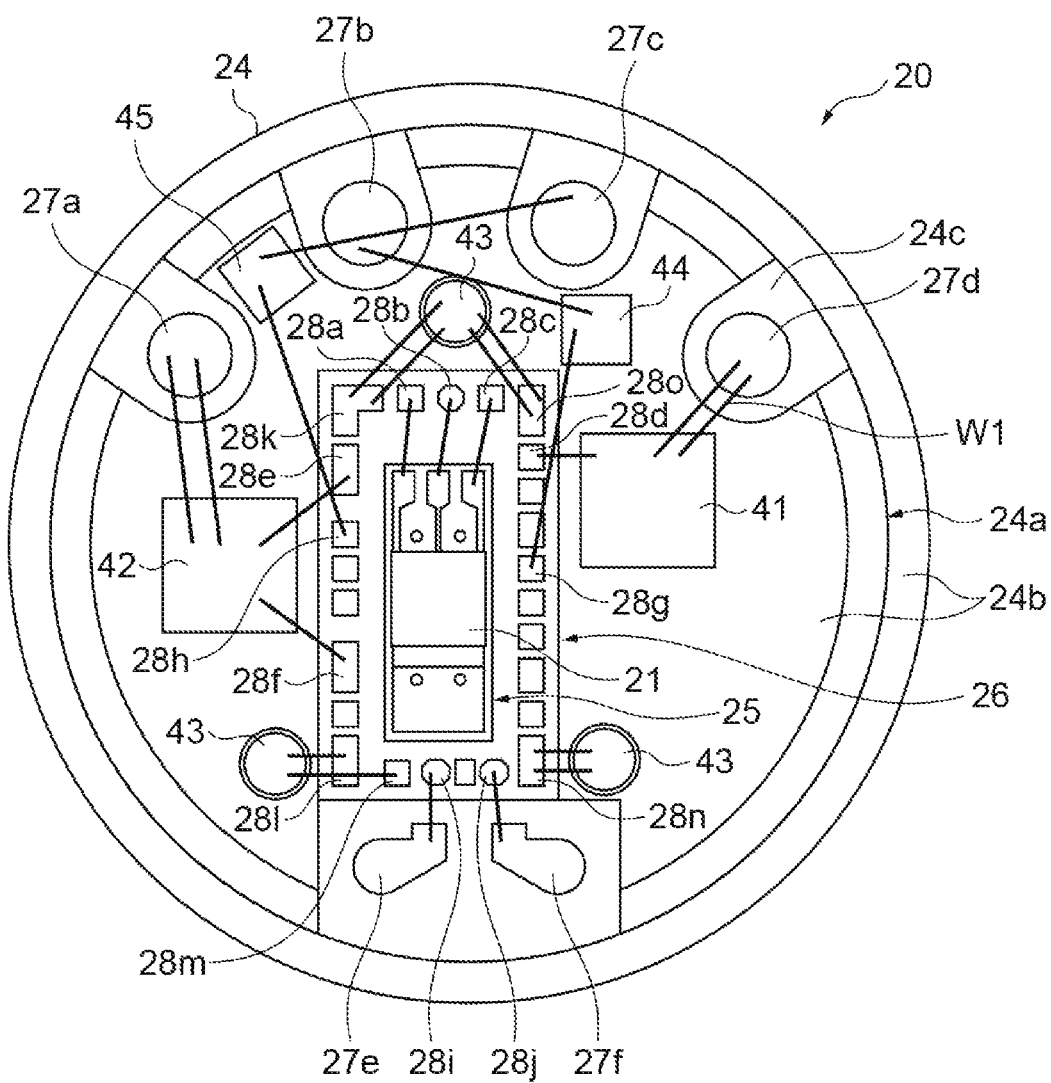
FIG. 7 is a plan view of the light receiving portion with a package and a lens removed.

FIG. 7 is a plan view of the light receiving portion 20 from which the package 22 and the lens 23 have been removed. As shown in FIG. 7, a GND pattern 24b defined by a reference potential (ground potential) is provided on the main surface 24a of the stem 24. Lead pins 27a to 27f included in the plurality of lead pins 27 are provided on the peripheral edge of the stem 24. The stem 24 has a plurality of insulating regions 24c for electrically isolating the GND pattern 24b on the main surface 24a and the lead pins 27a to 27f on the peripheral edge. Each of the plurality of insulating regions 24c is a region around the lead pins 27a to 27f. Capacitors 41, 42, 44, 45 are mounted on the GND pattern 24b. The GND pattern 24b has three openings, and conductive GND blocks 43 are provided on the main surface 24a exposed from each opening.

Here, the GND pattern 24b is an example of the first region in the present embodiment, and functions as the electrode pad 4 of the first embodiment. The upper surfaces of the lead pins 27a to 27f are an example of the second region in the present embodiment, and function as the electrode pad 5 of the first embodiment. The capacitors 41, 42, 44, 45 are an example of the electronic component in the present embodiment, and function as the semiconductor chip 3 of the first embodiment.

The integrated circuit chip 26 has a plurality of electrodes 28. In the present embodiment, each electrode 28 is an electrode pad. The plurality of electrodes 28 include electrodes 28a to 28o. The electrodes 28a to 28c are electrically connected to the photodiode 21. Specifically, the electrodes 28a, 28c are connected to a cathode electrode of the photodiode 21, and a bias voltage is applied to the photodiode 21. The electrode 28b is connected to an anode electrode of the photodiode 21 and receives a current signal output from the photodiode 21. The electrode 28d inputs the bias voltage to the photodiode 21 from the outside of the light receiving module 1A.

The electrode 28d is electrically connected to one electrode of the capacitor 41 via a bonding wire. The one electrode of the capacitor 41 corresponds to the electrode 3p of the first embodiment, and is electrically connected to the lead pin 27d via a bonding wire. The other electrode of the capacitor 41 is electrically connected to the GND pattern 24b via a conductive adhesive. The other electrode of the capacitor 41 corresponds to the electrode 3q of the first embodiment. In the present embodiment, the Ag paste 6 of the first embodiment is adopted as the conductive adhesive. The same applies to the following description.

The electrodes 28e, 28f input a power supply voltage to the integrated circuit chip 26 from the outside of the light receiving module 1A. The electrodes 28e, 28f are electrically connected to one electrode of the capacitor 42 (corresponding to the electrode 3p of the first embodiment) via a bonding wire. The one electrode of the capacitor 42 is electrically connected to the lead pin 27a via a bonding wire. The other electrode of the capacitor 42 (corresponding to the electrode 3q of the first embodiment) is electrically connected to the GND pattern 24b via a conductive adhesive. The electrode 28g is electrically connected to one electrode of the capacitor 44 (corresponding to the electrode 3p of the first embodiment) via a bonding wire. The one electrode of the capacitor 44 is electrically connected to the lead pin 27b via a bonding wire. The other electrode of the capacitor 44 (corresponding to the electrode 3q of the first embodiment) is electrically connected to the GND pattern 24b via a conductive adhesive.

The electrode 28h is electrically connected to one electrode of the capacitor 45 (corresponding to the electrode 3p of the first embodiment) via a bonding wire. The one electrode of the capacitor 45 is electrically connected to the lead pin 27c via a bonding wire. The other electrode of the capacitor 45 (corresponding to the electrode 3q of the first embodiment) is electrically connected to the GND pattern 24b via a conductive adhesive. The electrodes 28i, 28j output a voltage signal generated based on the current signal from the photodiode 21 to the outside of the light receiving module 1A. The electrode 28i is electrically connected to the lead pin 27e via a bonding wire. The electrode 28j is electrically connected to another lead pin 27f via a bonding wire.

Of the plurality of electrodes 28, the electrodes 28k to 28o define the reference potential (ground potential) of the integrated circuit chip 26. The electrodes 28k to 28o are electrically connected to the GND pattern 24b via bonding wires and the GND blocks 43. The other electrodes 28 include an electrode pad for current monitoring, an electrode pad for gain adjustment, and the like.

Figure 8:
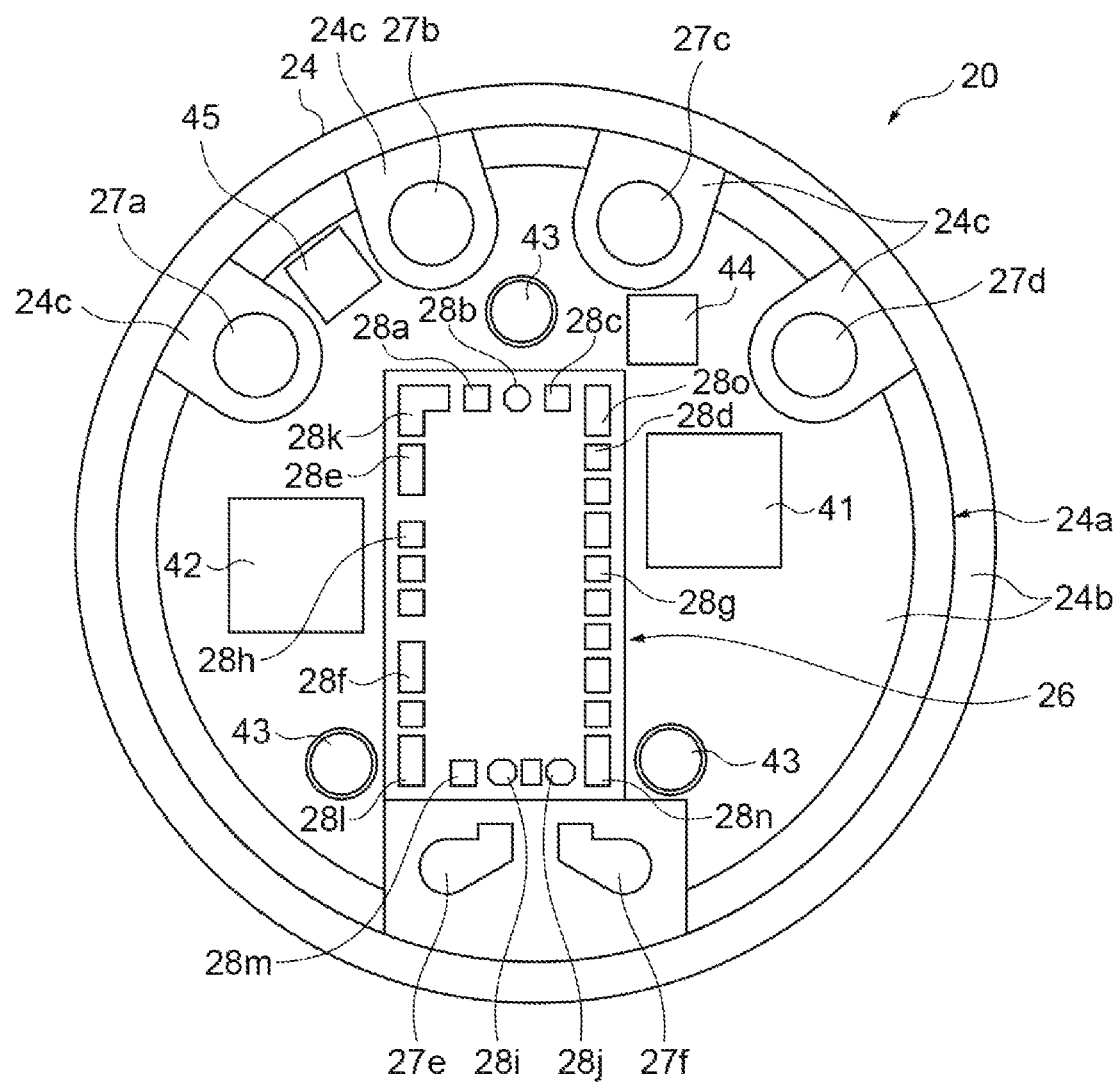
FIG. 8 is a plan view for explaining a method for manufacturing the light receiving module according to the second embodiment.
Figure 9:
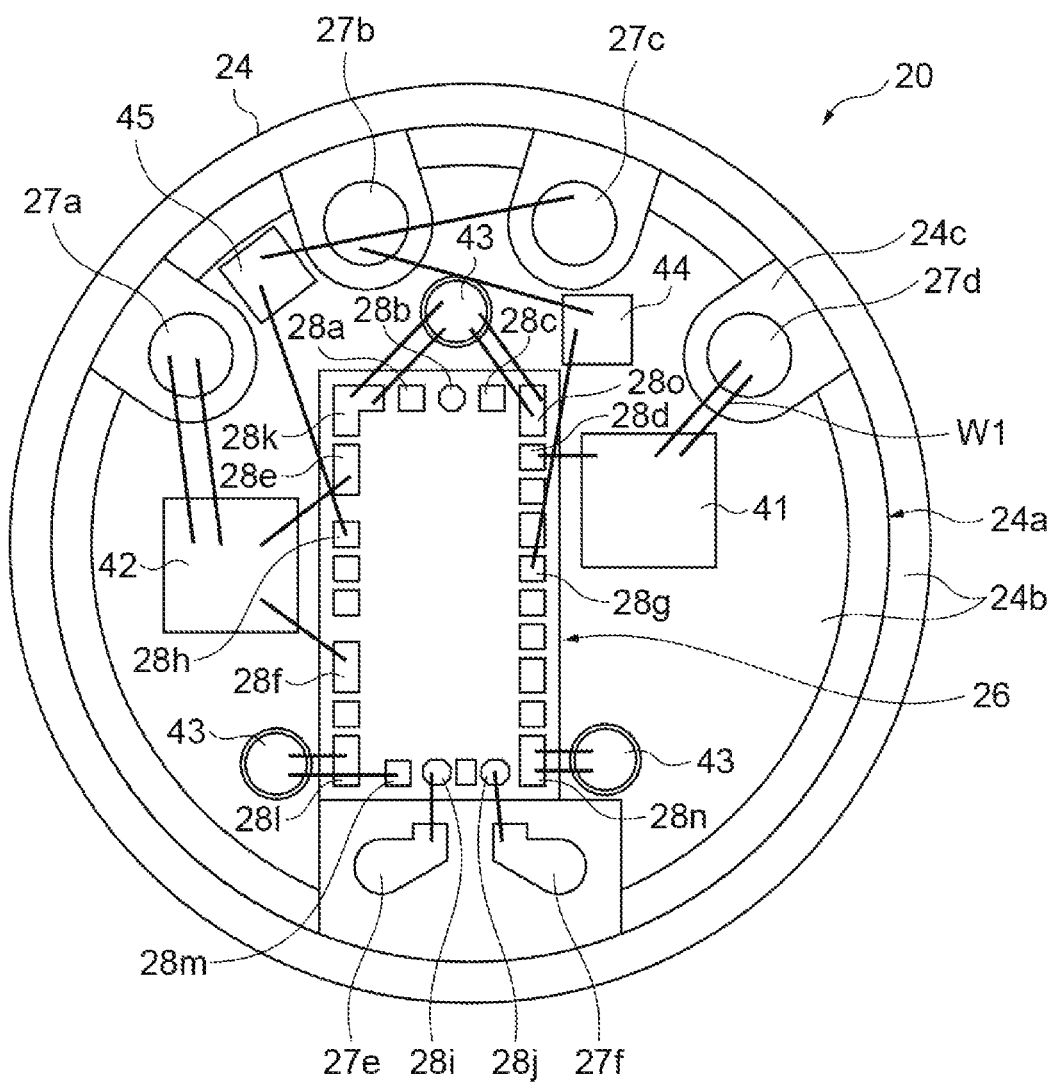
FIG. 9 is a plan view for explaining the method for manufacturing the light receiving module according to the second embodiment, following FIG. 8.

Next, an example of the method for manufacturing the light receiving module 1A according to the present embodiment will be described. Hereinafter, an example of the method for manufacturing the light receiving portion 20 will be specifically described with reference to FIGS. 8 and 9. FIGS. 8 and 9 are plan views for explaining the method for manufacturing the light receiving module 1A according to the second embodiment. First, the stem 24 is prepared in the same manner as in the first step of the first embodiment. The GND pattern 24b is provided in advance on the main surface 24a of the stem 24. The plurality of lead pins 27a to 27f are provided in advance on the peripheral edge of the stem 24. The integrated circuit chip 26 provided with the plurality of electrodes 28 may be further mounted on the main surface 24a of the stem 24 prepared here.

Next, as in the second step of the first embodiment, the upper surfaces of the lead pins 27a to 27f are covered with a plurality of molten resins 7. Here, from the viewpoint of avoiding exposure of the lead pins 27a to 27f, the resin 7 may be applied so as to cover the insulating region 24c. In that state, each resin 7 is cured by heating the stem 24 as in the first embodiment. After curing each resin 7, the stem 24 is cooled. When the stem 24 is cooled, the molten Ag paste 6 is applied on the GND pattern 24b as in the third step of the first embodiment. Specifically, the Ag paste 6 is potted or stamped in a plurality of regions of the GND pattern 24b on which the capacitors 41, 42, 44, 45 are mounted.

Next, the capacitors 41, 42, 44, 45 are mounted on the GND pattern 24b. First, the capacitors 41, 42, 44, 45 are placed on the plurality of Ag pastes 6 applied on the GND pattern 24b as in the placing step in the fourth step of the first embodiment. For example, the capacitor 41 is placed on the stem 24 with the one electrode facing away from the stem 24 and the other electrode facing the GND pattern 24b via the Ag paste 6. The same applies to the capacitors 42, 44, 45. Next, as in the heating step in the fourth step of the first embodiment, the stem 24 is heated with the capacitors 41, 42, 44, 45 placed on the plurality of Ag pastes 6 to cure the plurality of Ag pastes 6. Thus, the plurality of resins 7 are peeled from the lead pins 27a to 27f and the plurality of insulating regions 24c. Then, by removing each of the peeled resins 7 in the same manner as in the fifth step of the first embodiment, the mounting of the capacitors 41, 42, 44, 45 on the stem 24 is completed (see FIG. 8).

Next, wire bonding using the wire W1 is performed in the same manner as in the sixth step of the first embodiment. As shown in FIG. 9, in the present embodiment, the capacitor 41 and the lead pin 27d are wire-bonded, the capacitor 42 and the lead pin 27a are wire-bonded, the capacitor 44 and the lead pin 27b are wire-bonded, and the capacitor 45 and the lead pin 27c are wire-bonded. Thus, the capacitor 41 and the lead pin 27d are electrically connected via the wire W1. The capacitor 42 and the lead pin 27a, the capacitor 44 and the lead pin 27b, and the capacitor 45 and the lead pin 27c are electrically connected via the wire W1 electrically.

In the present embodiment, some of the plurality of electrodes 28 and the electronic components are wire-bonded. Specifically, the electrode 28d and the capacitor 41 are wire-bonded, the electrodes 28e, 28f and the capacitor 42 are wire-bonded, the electrode 28g and the capacitor 44 are wire-bonded, and the electrode 28h and the capacitor 45 are wire-bonded. Then, the electrode 28i and the lead pin 27e are wire-bonded, and the electrode 28j and the lead pin 27f are wire-bonded. Moreover, the electrodes 28k to 28o and the corresponding GND blocks 43 are wire-bonded. Wire bonding between some of the plurality of electrodes 28 and the electronic components may be performed before the upper surfaces of the lead pins 27a to 27f are covered with the plurality of molten resins 7.

Next, the carrier 25 on which the photodiode 21 is mounted is mounted on the integrated circuit chip 26. Then, the electrodes 28a to 28c and a plurality of wiring patterns provided on the carrier 25 and connected to the photodiode 21 are wire-bonded. Thus, the mounting of a plurality of electronic components including the capacitors 41, 42, 44, 45 on the stem 24 is completed. Subsequently, the package 22 and the lens 23 are attached to the stem 24 to complete the manufacturing of the light receiving portion 20. The light receiving module 1A is manufactured by fixing the light receiving portion 20 to the optical receptacle 10.

In the method for manufacturing the light receiving module 1A described above, since all the steps of the first embodiment are performed, the same operation and advantageous effect as those of the first embodiment can be obtained. In particular, when the Ag paste 6 is applied on the GND pattern 24b (first region), the upper surfaces of the lead pins 27a to 27f are covered with the resin 7. Thus, it is possible to suppress the occurrence of wire bonding failure.

Modification Examples

The above-described embodiments describe embodiments of the method for manufacturing the electronic device according to the present disclosure. The method for manufacturing the electronic device according to the present disclosure may be an arbitrary modification of each of the above-described embodiments.

Figure 10A:
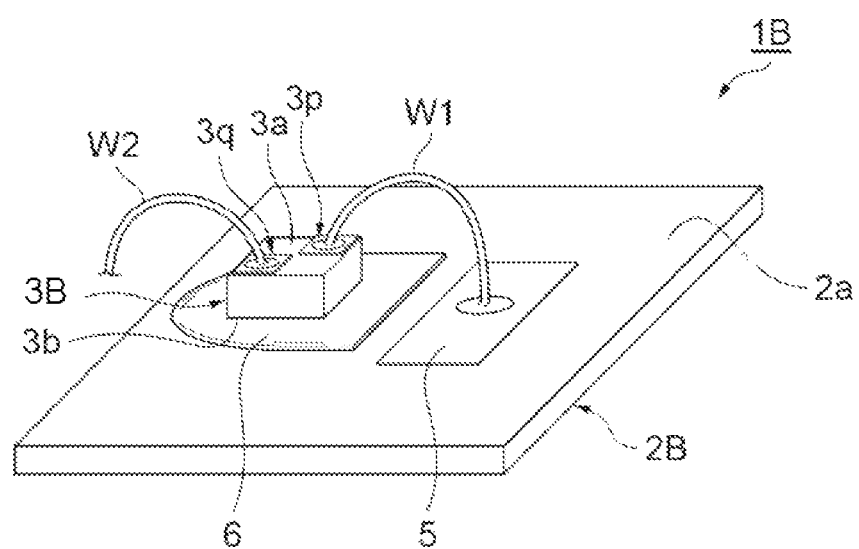
FIG. 10A is a perspective view showing a configuration of an electronic device according to a modification example.

For example, in the first embodiment, an example in which the first region is the electrode pad 4 having conductivity is described, but the first region is not limited to the one having conductivity. Further, in the first embodiment, the electrode 3q is formed on the second surface 3b of the semiconductor chip 3 as an electronic component, but the electronic component is not limited to the one in which the electrode 3q is formed on the second surface 3b. In other words, a non-metallized surface of the electronic component may be glued and fixed to the mounting substrate 2 by the Ag paste 6. FIG. 10A is a perspective view showing a configuration of an electronic device 1B according to one modification example. The electronic device 1B is different from the electronic device 1 in that a mounting substrate 2B is provided in place of the mounting substrate 2 and a semiconductor chip 3B is provided in place of the semiconductor chip 3. The differences will be described below.

The mounting substrate 2B is different from the mounting substrate 2 in that the electrode pad 4 is not provided on the main surface 2a. In the electronic device 1B, a part of the main surface 2a of the mounting substrate 2B made of aluminum oxide or aluminum nitride corresponds to the first region. Specifically, the first region in the electronic device 1B is a portion of the main surface 2a where the semiconductor chip 3 is arranged and a portion therearound where the electrode pad 5 is not arranged. The first region in the electronic device 1B may be a portion excluding the region where the electrode pad 5 is arranged and its surroundings. The semiconductor chip 3B is different from the semiconductor chip 3 in that both the electrodes 3p, 3q are formed on the first surface 3a and the electrode 3q is not formed on the second surface 3b. The electrodes 3p, 3q are arranged so as to be electrically isolated from each other on the first surface 3a. The semiconductor chip 3B may be a Trans Impedance Amp (TIA).

For example, in the case of a semiconductor chip 3B whose second surface 3b is not metallized, sufficient adhesion may not be obtained if it is mounted by using a brazing material such as solder or gold tin. On the other hand, sufficient adhesion is ensured by mounting by using the Ag paste 6. Further, when manufacturing this electronic device 1B, by applying the Ag paste 6 on the main surface 2a (first region) with the electrode pad 5 covered with the resin 7, the occurrence of wire bonding failure can be suppressed.

Figure 10B:
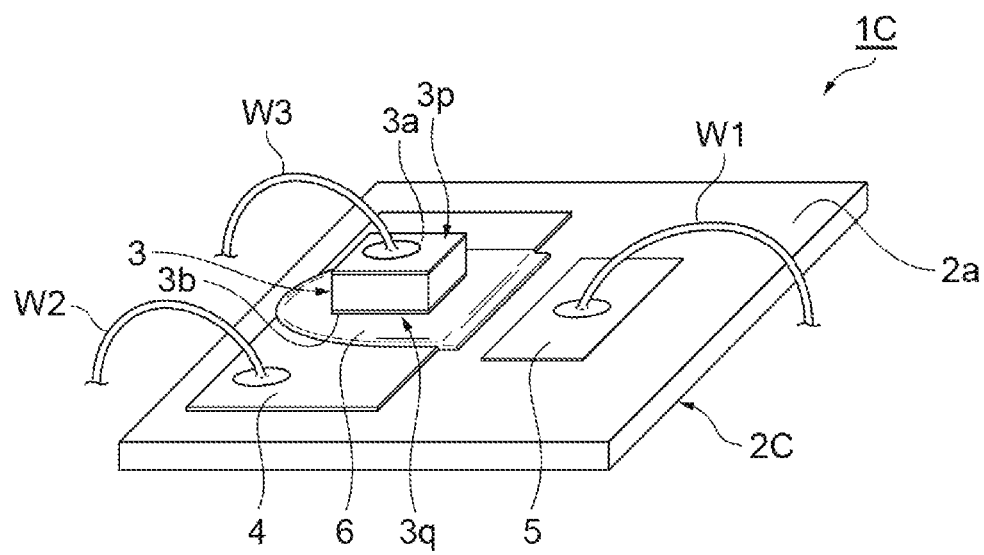
FIG. 10B is a perspective view showing a configuration of an electronic device according to another modification example.

In the first embodiment, the electrode 3p and the electrode pad 5 are wire-bonded, but the electrode 3p and the electrode pad 5 need not be electrically connected. FIG. 10B is a perspective view showing a configuration of an electronic device 1C according to one modification example. The electronic device 1C is different from the electronic device 1 in that it further includes a wire W3. In the electronic device 1C, the other end of the wire W1 is not connected to the electrode 3p, but is connected to another external electronic component (not shown) or the like. One end of the wire W3 is connected to the electrode 3p by wire bonding. The other end of the wire W3 is not connected to the electrode pad 5, but is connected to yet another external electronic component (not shown) or the like. When manufacturing this electronic device 1C, by applying the Ag paste 6 on the electrode pad 4 (first region) with the electrode pad 5 covered with the resin 7, the occurrence of wire bonding failure due to the wire W1 can be suppressed.

REFERENCE SIGNS LIST 1, 1B, 1C Electronic device
1A Light receiving module
2, 2B Mounting substrate
2a Main surface
3, 3B Semiconductor chip (electronic component)
3a First surface
3b Second surface
3p Electrode (first electrode)
3q Electrode (second electrode)
4 Electrode pad (first region)
5 Electrode pad (second region)
6 Ag paste (metal paste)
7 Resin
8 Heater block
8a Upper surface
10 Optical receptacle
11 Ferrule
11a Proximal end surface
11b Distal end surface
11c Outer peripheral surface
11d Fiber holding hole
12 Fiber stub
13 Optical fiber
13a One end
13b The other end
14 Metal member
14a Through-hole
14b Proximal end surface
14c Distal end surface
14d Outer peripheral surface
16 Sleeve
16a Proximal end
16b Distal end
16c Outer peripheral surface
16d Inner peripheral surface
18 Outer member
18a Flange portion
18b Proximal end surface
18c Distal end portion
18d Through-hole
18e First portion
18f Second portion
18g Stepped surface
19 Member
20 Light receiving portion
21 Photodiode (light receiving element)
21a Main surface
21b Opposite surface
22 Package
23 Lens
23a Resin
24 Stem
24a Main surface
24b GND pattern
24c Insulating region
25 Carrier
25a Second surface
25b First surface
26 Integrated circuit chip
26a Fourth surface
26b Third surface
27a to 27f Lead pin
28, 28a to 28o Electrode
29 Member
41, 42, 44, 45 Capacitor
43 GND block
W1, W2, W3 Wire (bonding wire)

The invention claimed is:

1. A method for manufacturing an electronic device, the method comprising:
preparing a mounting substrate provided with a first region to mount an electronic component thereon and a second region having conductivity;
covering the second region with a resin;
applying a metal paste on the first region;
mounting the electronic component on the first region with the metal paste; and
removing the resin covering the second region,
wherein the mounting includes heating the mounting substrate to cure the metal paste with the electronic component being placed on the metal paste applied on the first region, and
wherein the resin peeled from the second region by the heating is removed in the removing.

2. The method for manufacturing an electronic device according to claim 1, further comprising
connecting one end of a bonding wire to the second region.

3. The method for manufacturing an electronic device according to claim 1,
wherein the electronic component includes a first surface on which a first electrode is formed and a second surface on which a second electrode is formed facing away from the first surface,
wherein the first region is a conductive region electrically isolated from the second region, and
wherein the second electrode is connected to the first region via the metal paste so that the electronic component is mounted on the first region in the mounting.

4. The method for manufacturing an electronic device according to claim 3, wherein the first electrode and the second region are connected by wire bonding.

5. The method for manufacturing an electronic device according to claim 1, wherein the resin is a UV curable resin or a thermosetting resin.

6. The method for manufacturing an electronic device according to claim 1, wherein a material of a region around the second region of the mounting substrate is aluminum oxide or aluminum nitride.

7. The method for manufacturing an electronic device according to claim 1, wherein the resin is removed together with a part of the metal paste on the resin in the removing.

8. The method for manufacturing an electronic device according to claim 1, further comprising:
curing the resin by heating the mounting substrate at a first temperature before the applying.

9. The method for manufacturing an electronic device according to claim 8, wherein the mounting substrate is heated at a second temperature higher than the first temperature to cure the metal paste in the heating.

10. The method for manufacturing an electronic device according to claim 1, wherein the second region is covered with the resin so that the first region is not covered with the resin in the covering.

\* \* \* \* \*